(12) United States Patent
Van Bommel et al.

(10) Patent No.: US 9,140,415 B2
(45) Date of Patent: Sep. 22, 2015

(54) LIGHTING DEVICE WITH POLYMER CONTAINING MATRICES

(75) Inventors: Ties Van Bommel, Horst (NL); Rifat Ata Mustafa Ata Mustafa Hikmet, Eindhoven (NL); Roy Gerardus Franciscus Antonius Verbeek, Eindhoven (NL); René Theodorus Wegh, Veldhoven (NL); Josephus Paulus Augustinus Deeben, Valkenswaard (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 114 days.

(21) Appl. No.: 13/995,990

(22) PCT Filed: Dec. 15, 2011

(86) PCT No.: PCT/IB2011/055705
§ 371 (c)(1),
(2), (4) Date: Jun. 20, 2013

(87) PCT Pub. No.: WO2012/085780
PCT Pub. Date: Jun. 28, 2012

(65) Prior Publication Data
US 2013/0271955 A1    Oct. 17, 2013

(30) Foreign Application Priority Data
Dec. 21, 2010 (EP) ..................... 10196240

(51) Int. Cl.
| | | |
|---|---|---|
| *F21K 99/00* | (2010.01) | |
| *B82Y 30/00* | (2011.01) | |
| *H05B 33/14* | (2006.01) | |
| *F21V 9/16* | (2006.01) | |
| *C09K 11/06* | (2006.01) | |
| *H01L 33/50* | (2010.01) | |
| *F21Y 101/02* | (2006.01) | |
| *F21Y 105/00* | (2006.01) | |

(52) U.S. Cl.
CPC . *F21K 9/56* (2013.01); *B82Y 30/00* (2013.01); *C09K 11/06* (2013.01); *F21V 9/16* (2013.01); *H05B 33/14* (2013.01); *F21Y 2101/02* (2013.01); *F21Y 2101/025* (2013.01); *F21Y 2105/001* (2013.01); *H01L 33/505* (2013.01)

(58) Field of Classification Search
CPC ....................................... F21K 9/56
See application file for complete search history.

(56) References Cited

U.S. PATENT DOCUMENTS

| | | |
|---|---|---|
| 3,510,732 A | 5/1970 | Amans |
| 4,469,980 A | 9/1984 | Johnson |
| 6,850,002 B2 | 2/2005 | Danielson et al. |

(Continued)

FOREIGN PATENT DOCUMENTS

| | | |
|---|---|---|
| JP | 2005223276 A | 8/2005 |
| WO | 2007009010 A2 | 1/2007 |
| WO | 2007051499 A1 | 5/2007 |

*Primary Examiner* — Elmito Breval
(74) *Attorney, Agent, or Firm* — Yuliya Mathis

(57) ABSTRACT

The invention provides a lighting device (1) comprising (a) a light source (100), for producing light source light (110), and (b) a transparent converter device (200), for converting at least part of the light source light (110), wherein the transparent converter device (200) comprises a first polymer containing matrix (201) containing discrete particles (210), wherein the discrete particles (210) comprise a second polymer containing matrix with luminescent material (212) dispersed therein.

21 Claims, 3 Drawing Sheets

(56) References Cited

U.S. PATENT DOCUMENTS

| | | |
|---|---|---|
| 7,115,217 B2 | 10/2006 | Kummer et al. |
| 7,579,769 B2 | 8/2009 | Wu et al. |
| 2005/0179366 A1 | 8/2005 | Rose et al. |
| 2006/0055316 A1 | 3/2006 | Wu et al. |
| 2006/0138938 A1 | 6/2006 | Tan et al. |
| 2010/0065873 A1 | 3/2010 | Bhattacharya et al. |
| 2010/0123155 A1 | 5/2010 | Pickett et al. |
| 2010/0247893 A1 | 9/2010 | Zimmerman |

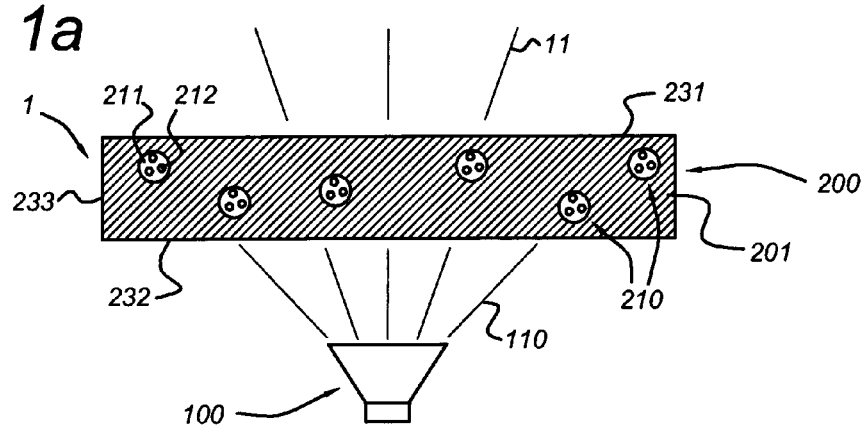
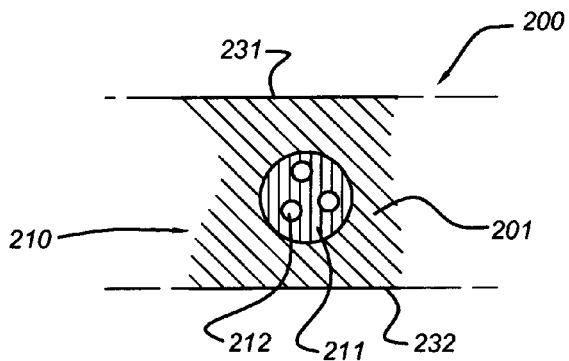
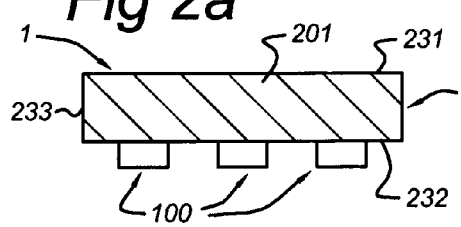 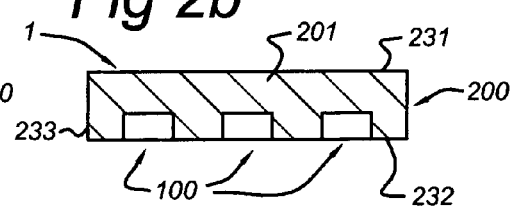
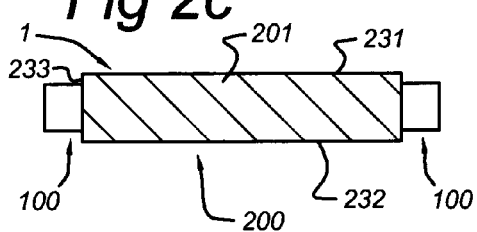 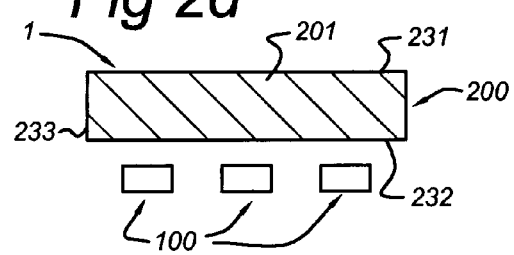

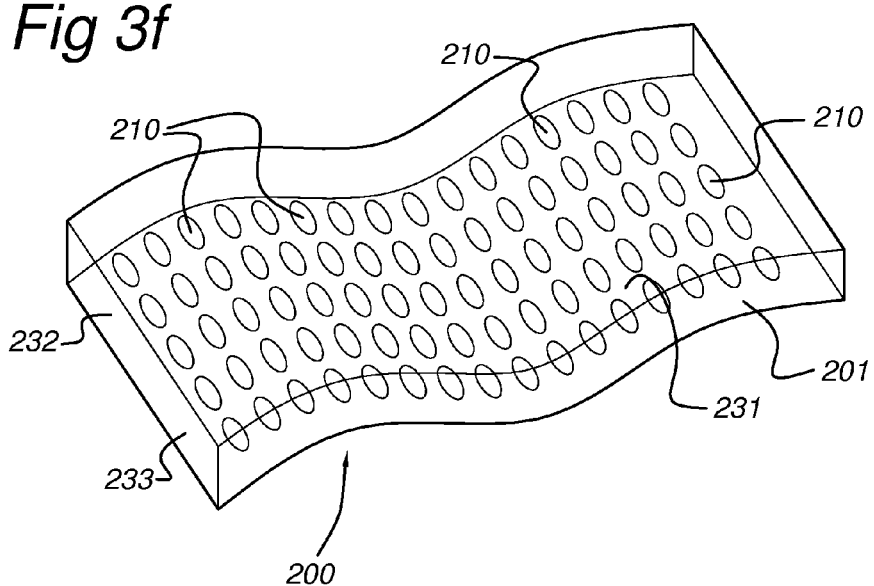
Fig 3f
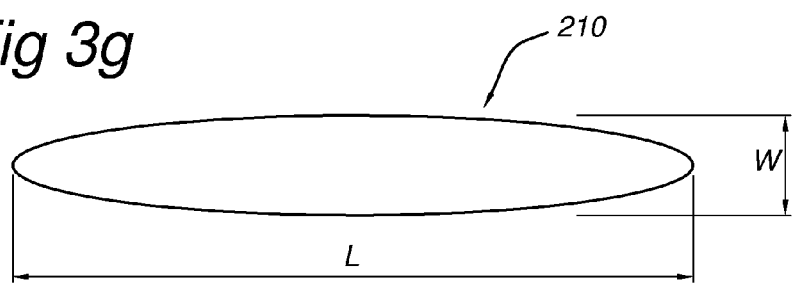
Fig 3g
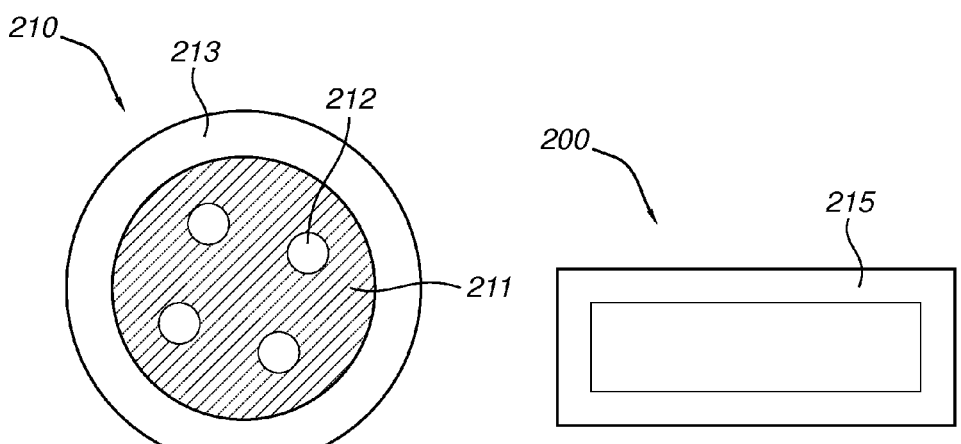
Fig 3h
Fig 3i

LIGHTING DEVICE WITH POLYMER CONTAINING MATRICES

FIELD OF THE INVENTION

The invention relates to a lighting device comprising (a) a light source, for producing light source light, and (b) a transparent converter device, as well as to such converter device per se.

BACKGROUND OF THE INVENTION

Luminescent materials in matrices are known in the art. US2006055316 for instance describes color electroluminescent displays comprising a sub-pixel structure and method for making the same. The sub-pixel structure has an electroluminescent phosphor, which emits blue light, and a photo luminescent phosphor, which emits at least one other color as a result of absorption of the blue light. US2006055316 also describes such photo luminescent phosphor materials. For instance, this document describes a method for making a photo luminescent phosphor material, the method comprising mixing a pigment powder and a matrix material to provide a uniform dispersion of the pigment powder in the matrix material, wherein the pigment material comprises a solid solution of organic photo luminescent molecules, the matrix material being chemically and physically compatible with the pigment powder such that the photo luminescent efficiency of the organic photo luminescent molecules are substantially maintained.

SUMMARY OF THE INVENTION

Known prior art systems may lead to light converters comprising luminescent material that are not efficient. Especially organic luminescent materials may cause a problem when embedding in certain types of matrix material. For instance, in some applications the organic luminescent material is brought into a polymeric matrix. The polymeric matrix can be produced by either polymerization of a monomer or solution processed. In the case of polymerization of a monomer it may not be possible to use photo-initiated polymerization as during photo induced polymerization process the luminescent molecules may degrade.

Hence, it is an aspect of the invention to provide an alternative lighting and/or transparent converter device, which preferably further at least partly obviate one or more of above-described drawbacks.

It is suggested to first bring the luminescent material, such as organic luminescent molecules, in a matrix (herein also called "second matrix", or "second polymer containing matrix") where the luminescent material is (molecularly) dispersed and may have a good photo-chemical stability. Subsequently, particles, such as for instance flakes etc. of this material can be produced and then dispersed it in another matrix (herein also called "first matrix", or "first polymer containing matrix") to produce a composite transparent converter device, for instance with high flexibility, but also good luminescence and photo-chemical stability.

It is further suggested that the first polymer containing matrix has preferably a relatively low oxygen transmission rate and a relatively high transparency.

It is further suggested to use particles of luminescent material, such as luminescent molecules in a polymer containing matrix dispersed in a polymeric binder. The particles can be dispersed for example in a mainly water based dispersion and applied to various surfaces which can be used for light conversion. In this way, currently used inorganic luminescent material processing platform is maintained avoiding also environmental issues.

The use of particles of luminescent materials, such as luminescent molecules, dispersed in a polymeric binder can also be of advantage when for instance shaped forms need to be coated (for instance with a protective coating, see also below).

In a first aspect, the invention provides a lighting device comprising (a) a light source, for producing light source light, and (b) a transparent converter device, for converting at least part of the light source light, wherein the transparent converter device (herein also indicated as "converter device") comprises a first polymer containing matrix containing discrete particles, wherein the discrete particles (herein also indicated as "particles") comprise a second polymer containing matrix with luminescent material dispersed therein. Hence, the second polymer containing matrix is contained as particles (such as flakes) in the first polymer containing matrix.

Such converter device may be stable, may be efficient, may be flexible, may be applied in a relatively easy way, etc. Further, the first matrix may also function as a barrier, e.g. oxygen barrier, which may for instance be beneficial in view of lifetime improvement (of the luminescent material).

In yet a further aspect, the invention provides such transparent converter device per se, i.e. a transparent converter device, for converting at least part of light source light, comprising a first polymer containing matrix containing discrete particles, wherein the discrete particles comprise a second polymer containing matrix with luminescent material dispersed therein.

The term "matrix" is used herein to indicate a layer or body or particle, which hosts another material, such as the first matrix being a matrix for the second matrix, and the second matrix being a matrix for the luminescent material.

The transparent converter device may be a layer, for instance coated to a transparent support. The transparent converter device may also be self supporting, and for instance be a plate or a flexible entity.

The transparent converter device may include an inorganic or an organic luminescent material, or a combination thereof. The term "luminescent material" may also relate to a plurality of luminescent materials. Organic luminescent materials are herein also indicated as organic dyes.

In an embodiment, the luminescent material comprises an inorganic luminescent material, selected from the group consisting of a lanthanide based luminescent material, a transition metal based luminescent material and a quantum dot material. Hence, for instance inorganic luminescent materials known from solid state lighting or from low-pressure or high-pressure lamps, or from plasma applications may be applied. Inorganic materials that for instance may be applied are trivalent cerium doped garnet systems, such as YAG:$Ce^{3+}$, and divalent Eu doped thiogallates, such as $SrGa_2S_4$:$Eu^{2+}$, and sulfides, such as SrS:$Eu^{2+}$, all well known in the art (see for instance U.S. Pat. No. 7,115,217 or U.S. Pat. No. 6,850,002). Also quantum dots (QD) may be applied.

In an embodiment, the luminescent material comprises an organic dye (also known as organic phosphor organic luminescent material). The organic luminescent material may for instance comprise one or more perylene derivatives such as materials known as names Lumogen F Yellow 083, Lumogen F Yellow 170, Lumogen F Orange 240, Lumogen F Red 305, Lumogen F Blue 650, which may for instance be provided by BASF.

Organic luminescent materials are currently being considered for remote luminescent material applications where blue light emitting diodes are used for pumping for instance green to red emitting luminescent material in order to obtain white light. Organic luminescent materials may have a number of advantages as compared with inorganic luminescent materials. The position and the band width of the luminescence spectrum can be designed with ease to be anywhere in the visible range to obtain high efficacy. They can also show much less light scattering and higher quantum efficiency further improving the system efficiency. Furthermore because of their organic and sustainable nature they may be several orders of magnitude cheaper than the inorganic LED luminescent materials so that they can be used in large area applications.

One of the interesting applications of organic luminescent material is in flexible configurations. For this purpose the organic luminescent material is in an embodiment brought (such as molecularly dissolved or dispersed) in such a flexible matrix.

However, as indicated above, also an inorganic luminescent material may be applied, or a combination of an inorganic luminescent material and an organic luminescent material.

The first polymer containing matrix relates to a matrix which comprises a first polymer. The matrix may comprise also other components. In a specific embodiment, the first matrix essentially consists of the first polymer.

The first polymer containing matrix may in an embodiment comprise a binder containing coating layer. For instance, the polymer containing matrix is first provided as coating layer, especially comprising polymeric binders. The coating layer may be provided to a support, such as a transparent support, and after applying the coating, the coating may be dried or cured. In this way, a coating layer may be provided, like in classical lighting applications using luminescent material coating layers. However, herein the first matrix does not contain luminescent particles or molecules per se, but polymer matrix particles which have therein dispersed luminescent material. Optionally, in addition the first matrix may also contain luminescent material (thus in addition to the luminescent material comprised by the second matrix particles), see also below.

Hence, in an embodiment the first polymer containing matrix comprises a binder containing coating layer. Typical binders are for instance acrylate binders, epoxy binders and polyviny alcohol (PVA) binders. Hence, in a specific embodiment, the first polymer containing matrix may be a matrix comprising on one or more of acrylate binders, epoxy binders and polyviny alcohol (PVA) binders.

The term "first polymer containing matrix" may in an embodiment especially refer to a hardened or cured layer.

The layer thus provided may be continuous or discontinuous. Especially, when using coating applications with binder wherein part of the starting material (from the binder containing coating layer) may evaporate, the coating layer may contain (small) cracks, and thus be considered discontinuous.

In yet another embodiment, the first polymer containing matrix may especially be a matrix comprising one or more of a poly urethane, a polyalkane, a polyacrylate and a siloxane (such as a polydimethyl siloxane (PDMS)). This may especially be of relevance for flexible applications. Hence, in an embodiment, the first polymer containing matrix is a flexible matrix. In this way, the transparent converter device may be a flexible unit.

The second polymer containing matrix relates to a matrix which comprises a second polymer. The matrix may comprise also other components. In a specific embodiment, the second matrix essentially consists of the second polymer.

The second polymer containing matrix, i.e. the matrix that is the building material of the particles, may especially be a matrix comprising on one or more polymers selected from the group consisting of PEN (polyethylene napthalate), PC (polycarbonate), polymethylacrylate (PMA), polymethylmethacrylate (PMMA) (Plexiglas or Perspex), cellulose acetate butyrate (CAB), polyvinylchloride (PVC), polyethyleneterephthalate (PET) (and its copolymers), (PETG) (glycol modified polyethyleneterephthalate), COC (cyclo olefin copolymer), and polystyrene.

In general, the chemical composition of the first polymer is substantially different from the second polymer. Further, in general the chemical composition of the first matrix is different from the second matrix (even irrespective of the luminescent material). Hence, in an embodiment the first polymer containing matrix comprises a first polymer and the second polymer containing matrix comprises a second polymer, and the first and the second polymer are substantially different. Especially, organic luminescent materials are not included in this comparison (although their wt. % in the second matrix may be relatively small, see below). In an embodiment, wherein both the first matrix and the second matrix would contain substantial identical polymers, the weight percentage of such substantial identical polymers will at least in one matrix be lower than 50 wt. %, especially lower than 20 wt. %, especially lower than 10 wt. %. In general however, the first and second matrix are substantially different, with the weight percentage of substantial identical polymers in one phase being substantially lower than 5 wt. %, like for instance when the first matrix is based on PDMS and the second matrix is based on PMMA (substantially 0 wt. % substantially identical polymers).

Some specific luminescent materials are indicated above. Typically, concentrations of (organic) luminescent (molecules) in the second polymer containing matrix, may range from 0.00001 wt % up to 5 wt % (relative to the total weight of the first matrix. In another embodiment, the particles, such as flakes, may contain a combination of organic luminescent molecules. In the case of quantum dots the concentration may even range from 1 ppm by weight up to 1% wt with respect to the second polymer containing matrix. In the case of inorganic luminescent materials the concentration can range from 1 wt. % to 50 wt. % with respect to the second polymer containing matrix.

The concentration of the particles of the second polymer containing matrix in the first polymer containing matrix may be in to range 1-90 wt. % (relative to the total weight of the first and second matrix), such as in the range of 2-70 wt. %, like at least 5 wt. %.

In order to obtain a white emitting lighting device (with a desired correlated color temperature (CCT) and color rendering index (CRI)) it may be necessary to partially convert blue light from the light source(s), such as LED(s), to other colors using combination of different types of organic luminescent molecules and/or different types of inorganic luminescent materials.

The second polymer matrix can be made by processed known in the art, in the presence of the luminescent material, for instance by providing a mixture comprising monomers and the luminescent material and polymerizing the mixture. After polymerizing, the product may be (laser) cut, or milled, etc. into particles. The mixture may also be hardened in cavities having the desired shape for the final particles (mould).

The discrete particles may have dimensions in the range of 0.1 μm-5 mm. The particles may have any desired shape, such as spherical, cubic, star-like, cylindrical, etc. The converter device may also comprise differently shaped discrete particles. In order to facilitate a homogeneous conversion of the light over the converter device, it might be beneficial to use non-spherical particles, but to use particles having an aspect ratio larger than 1. The aspect ratio is the ratio length/width. In a specific embodiment, the discrete particles have length/width aspect ratios of at least 2, especially at least 10. Different particles may have different aspect ratios. The converter device may comprise a plurality of particles having different aspect ratios.

The particles are indicated as "discrete", since the particles can be distinguished from the first matrix. Boundaries between particles and first matrix can be observed and difference in chemical composition between first matrix and particle can be evaluated.

The light source, which is used in the lighting device to provide light source light to the converter device, may at least partially be embedded in the transparent converter device. For instance, a self-supporting converter device may comprise one or more indentations or cavities, to host at least partially one or more light source(s), respectively. In yet another embodiment, the light source and converter device may be configured to provide light source light in an edge of the converter device. The light source may be in contact with the converter device but may also be arranged at a non-zero distance from the converter device. In a specific embodiment, the light source comprises a solid state LED light source. In another embodiment, the light source comprises a laser diode. In an embodiment, an array of light sources is applied to illuminate the converter device. Combinations of different types of light sources may be applied.

The converter device may have any shape, such as a layer or a self supporting body. It may be flat, curved, shaped, squared, round hexagonal, spherical tubular, cubic, etc. The self supporting body may be rigid or flexible. The thickness may in general be in the range of 0.1-10 mm. The length and/or width (or diameter) may be in the range of for instance 0.01-5 m, such as 0.02-5 m, for instance 0.1-50 mm.

In an embodiment, polymeric luminescent particles, such as flakes, may have a (additional) coating. Such particles, such as flakes, may for instance be obtained by protecting a luminescent foil at one or preferably both sides, with a barrier layer and subsequently cutting such coated foil into particles, such as (high aspect ratio) flakes.

The transparent converter device (with for instance flakes) may include (incorporated in the first matrix (and/or in the first matrix)) additional materials, such as getters to improve lifetime.

In a further embodiment, the discrete particles and/or the converter device further comprise a coating layer for improving the life-time of the luminescent material. The coating layer reduces the transport of oxygen into the discrete particle resulting in a slower degradation of the luminescent material. In this way the coating layer improves the life time of the luminescent material and hence that of the converter device.

In a further embodiment, the first polymer containing matrix of the transparent converter device or the lighting device, has an oxygen transmission rate of equal to or less than 50 $cm^3/m^2 \cdot day \cdot bar$, preferably equal to or less than 25 $cm^3/m^2 \cdot day \cdot bar$, more preferably equal to or less than 5 $cm^3/m^2 \cdot day \cdot bar$, even more preferably equal to or less than 1 $cm^3/m^2 \cdot day \cdot bar$. The lower the oxygen transmission rate of the first polymer containing matrix is, the less amount of oxygen will diffuse into the first polymer containing matrix and the lower the degradation rate of the luminescent material, in particular in case of an organic phosphor material or a quantum dot material, will be.

In a further embodiment, the transparent converter device may comprise particles comprising an organic luminescent material while inorganic luminescent material is comprised (directly) by the first matrix. In an embodiment, this may also be the other way around.

In an embodiment, the particles comprise flakes, and the flakes consist of multiple layers.

In another embodiment, the converter device, i.e. especially the first matrix, may further contain structures, such as particles, like $Al_2O_3$ containing particles and/or $TiO_2$ containing particles, to e.g. promote extracting the light from the converter device.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

The term "transparent" herein may especially refer to a converter device that has a light transmission in the range of 90-100%, for light having a wavelength selected from the visible wavelength range. Herein, the term "visible light" especially relates to light having a wavelength selected from the range of 380-780 nm. The transmission can be determined by providing light at a specific wavelength with a first intensity to the waveguide under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989). Note that the waveguide plate may be colored, due to the presence of luminescent material (see also below).

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim.

The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 1a-1b schematically depict basic embodiments according to the invention;

FIGS. 2a-2d schematically depict specific configuration of the converter device and light source(s);

FIGS. 3a-3i schematically depict a number of variants and options within the present concept.

Figure 3A:
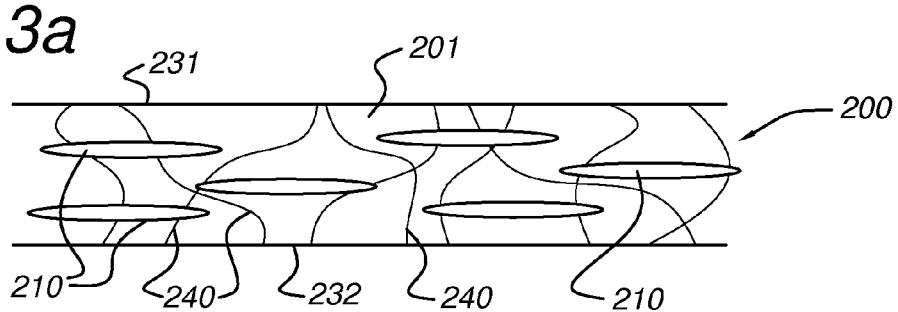

The drawings are not necessarily on scale.

DETAILED DESCRIPTION OF THE EMBODIMENTS

FIG. 1 schematically depicts a lighting device 1 which comprises (a) a light source 100, such as a solid state LED or laser diode, for producing light source light 110. This may for instance be UV, violet or blue light, especially blue light. The light source 100 may also be a plurality of light sources (see examples below), which may produce light source light 110 having substantially the same wavelength distributions or having different wavelength distributions (such as UV and blue light). Especially, visible light is produced, such as blue light and/or one or more of green, yellow, orange and red light.

The lighting device 1 further comprises (b) a transparent converter device 200. The converter device 200 is arranged downstream of the light source 100. This converter device 200 is especially configured for converting at least part of the light source light 110. For instance, blue light may be at least partially converted to one or more of green, yellow, orange and red light. When producing lighting device light, indicated with reference 11, of white nature, and the light source light 110 being of blue nature, the transparent converter device 200, will convert part of the light source light 110 but also allow part of the light source light 110 transmit through the transparent converter device 200. The lighting device light 11 is shown at the downstream side of the converter device 200 (i.e. emanating from the front face).

The transparent converter device 200 comprises a first polymer containing matrix 201 containing discrete particles 210. In fact, the discrete particles 210 are embedded in the first polymer containing matrix 201.

The discrete particles 210 comprise a second polymer containing matrix 211 with luminescent material 212 dispersed therein. The luminescent material 212 is the converter, which absorb at least part of the light source light 110, and generated luminescent material light. Light 11 escaping from the converter device 200 comprises at least the light generated by the luminescent material 212, but may optionally also comprise light source light 110. For instance, the light source light 110 may be blue light and the luminescent material light might be yellow and red light. Together, white light as lighting device light 11 may be generated.

The luminescent material 212 in the device 1 may be lit by LEDs behind the (flexible) configuration. For instance, a full array of LEDs can be used (see also below). The converter device 200 has a back face 232 and a front face 231, and in general an edge 233. The converter device 200 may be lit in a direction from the back face 232 to the front face 231. Optionally and/or additionally, the converter device 200 may be lit at the edge face 233 with the light source(s) 100.

FIG. 1b schematically depicts in more detail the converter device 200. The discrete particles 210 are embedded in the first matrix 201. The particles 210 themselves comprise the second matrix material 211, with luminescent material 212 embedded therein. Here, by way of example, particulate luminescent material is depicted, but the luminescent material 212, for instance when comprising an organic dye, may also be molecularly dispersed in the second matrix 211. As mentioned above, in an embodiment also the first matrix 201 may comprise luminescent material (not depicted) (in addition to the second matrix 211 comprising luminescing material 212) such as inorganic luminescent material.

FIGS. 2a-2d schematically depict specific configuration of the converter device and light source(s). FIG. 2a depicts and embodiment wherein the converter device 200 is lit by light sources 100, especially LEDs, which are in a contact position.

FIG. 2b schematically depicts an embodiment wherein the light source(s) 100 are at least partially embedded in the converter device 200. To this end, the converter device 200 may comprise cavities, for instance in the back face 232.

In FIG. 2c, the converter device 200 is lit by one or more light sources 100, especially LEDs or laser diodes, which are at the edge(s) 233 of the converter device 200, a so-called edge-lit configuration. By using such configuration very thin (flexible) lighting devices can be created. This is of special interest. The light source(s) 100 are depicted to be in contact with the converter device 200, but are not necessarily configured in such a way (see by way of example also FIG. 2d). In this configuration light may also be coupled from sides into a transparent wave guide (not shown) which can illuminate the converter device. In this configuration the converter device does not need to be in optical contact with the wave guide.

In FIG. 2d, the converter device 200 is lit by one or more light source(s) 100, especially LEDs or laser diodes, which are in a non-contact position. Such a configuration may be desirable in flexible luminaire systems.

For all lighting devices 1 described herein applies that the converter device 200 may comprise one or more optical layers or optical items, such as reflective layers or mirrors, wavelength selective layers or mirrors, etc. For the sake of clarity, such layers or items have not been depicted.

Further, in a specific embodiment, blue emitting LEDs are used. In a further embodiment, LEDs emitting at different wavelength(s) can be used as well.

Not depicted, but also included herein, are configurations wherein at the side of the front face 231 a reflector or reflector layer is arranged, configured to reflect luminescent material light and optionally light source light 110 in a direction from the back face 232, and lighting device light 11 emanates from the back face 232 of the lighting device 1.

All kind of shapes of discrete particles 210 may be applied. FIGS. 3a-3e (and 3g) schematically depict particles 210 having an elongated shape, i.e. having an aspect ratio larger than 1.

Figure 3B:
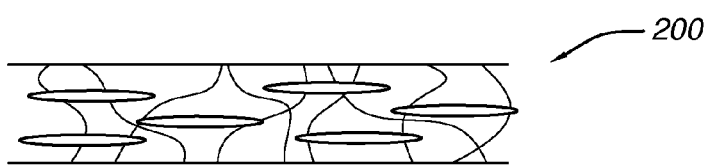
Figure 3C:
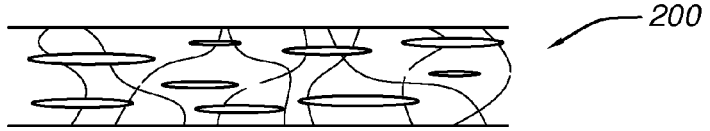
Figure 3D:
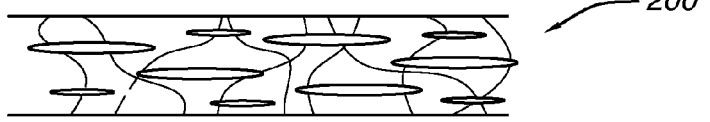

FIGS. 3a-3e schematically depict embodiments wherein the converter device 200 is a layer with binder polymer, that has been cured or hardened. Binding polymer 240 forms a matrix to hold particles together. For instance, a liquid binder composition as polymer containing matrix, containing the discrete particles, may be applied to a substrate and hardened. FIGS. 3b-3e schematically depict a non-limiting number of different variants. FIG. 3b is the same as FIG. 3a, whereas FIG. 3c schematically depicts an embodiment wherein the discrete particles 210 have different dimensions, here a plurality of different dimensions. FIG. 3d schematically depicts an embodiment, wherein the discrete particles 210 comprise two subsets of particles, wherein within each subset, the discrete particles 210 substantially have the same dimensions. Hence, the particles 210 can have approximate same size (shape or thickness), different size, or two kind of sizes, etc.

Figure 3E:
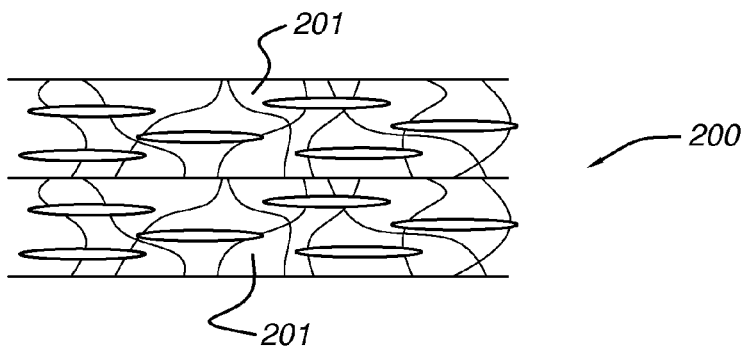

FIG. 3e schematically depicts an embodiment with two layers 201, in fact two converter devices, which can be assembled in one integral converter device 200. As will be clear to a person skilled in the art, more than two layers 201 may be applied. Further, the layers 201 may be in physical contact with adjacent one or more neighboring layers, but may also be arranged at a non-zero distance. Further, when using more than one layer, the luminescent materials in the different layers may optionally also differ. For instance, an upstream layer may comprise a luminescent material converting at least part of the light source light 110 into green light, and a downstream layer may comprise a luminescent material converting at least part of the light source light 110 and/or luminescent material light of the downstream layer luminescent material into red light.

FIGS. 3a-3e schematically depict converter devices that look like binder based layers. However, as will be clear to a person skilled in the art, the same principles with respect to aspect ratio, number of layers, may also apply to self-supporting bodies.

Hence, the layer may comprise discrete particles 210 containing different luminescent materials 212. The concentration of the luminescent material 212, especially when being organic luminescent material in the second polymer containing matrix 202 is typically between 0.00001-5 wt %.

In an embodiment, the particles, such as flakes, may contain a combination of organic luminescent molecules.

In the case of quantum dots the concentration may range from 1 ppm by weight up to 1 wt. % with respect to the second polymer containing matrix. In the case of inorganic phosphors the concentration can range from 1 wt. % to 50 wt. % with respect to the second polymer containing matrix. The concentration of the particles of the second polymer congaing matrix may be in to rage 1-90 wt. % in the first polymer containing matrix.

The concentration to be used depends various parameters including layer thickness of the layer (or foil), and thickness and concentration of the discrete particles.

Examples of organic luminescent materials include but are not limited to perylene derivatives such as Lumogen Red f305, Lumogen Orange f240, Lumogen Yellow f083 or Lumogen Yellow f170 which can be purchased from BASF. They can also be quantum dots such as InP, CdSe, etc The system mat also comprise nano or micron sized inorganic luminescent materials such as YAG:Ce, LuAG:Ce etc. The matrix material can be for example PMMA, PET, PEN, PC, etc. The first polymer matrix, especially when used as binder, can be for example an acrylate, epoxy, PVA, etc. The solvent can be water, but also other "friendly" solvents can be used such as ethanol, propanol, isopropanol, etc. Particles or binder may comprise a getter to improve the lifetime of the luminescent material. In another embodiment several layers are stacked on top of each other. The first polymer containing matrix preferably has a relatively low oxygen transmission rate, and can for example comprise the following polymer materials, with the oxygen transmission rate of the polymer material indicated between brackets: PVDC—poly vinylidene chloride (0.8 $cm^3/m^2 \cdot day \cdot bar$), PVDF—poly vinylidene fluoride (0.8 $cm^3/m^2 \cdot day \cdot bar$), EVOH—ethylene vinyl alcohol (0.5 $cm^3/m^2 \cdot day \cdot bar$), PBT—polybutylene terephthalate (5 $cm^3/m^2 \cdot day \cdot bar$), PEN—Poly ethyle naphthalate (8 $cm^3/m^2 \cdot day \cdot bar$), PAN—Poly acrylo nitrile (9 $cm^3/m^2 \cdot day \cdot bar$), PA6—Nylon6 (10 $cm^3/m^2 \cdot day \cdot bar$) or PET—Poly ethylene terephthalate (20 $cm^3/m^2 \cdot day \cdot bar$).

FIG. 3f schematically depicts a flexible converter device 200.

FIG. 3g schematically depicts an embodiment of the discrete particle 210. The particle 210 has in this embodiment a length L and a width W, which leads to an aspect ratio L/W, which is here larger than 1.

An example of discrete particles 210 are for instance flakes. Discrete particles 210, such as flakes, can have a size preferably below 2 mm, more preferably below 0.5 mm, most preferably below 0.1 mm. Discrete particles 210, such as flakes, can have random shaped or specific shapes such as squares, hexagons, triangles, etc. The thickness of the discrete particles 210, such as flakes, is typically below 100 um, more preferred below 10 um but is of course dependent on the size of the discrete particles 210, such as flakes.

High aspect ratio discrete particles 210, such as flakes, can have aspect ratio preferable above 10, more preferably above 100.

Luminescent polymer discrete particles 210, such as flakes, can be made using various production techniques including but not limited to milling, mechanical cutting, laser cutting, lithography, etc.

FIG. 3h schematically depicts an alternative embodiment of the discrete particle 210. The discrete particle 210 comprises a second polymer containing matrix 211 with a luminescent material 212 dispersed therein. The discrete particle 210 further comprises a coating layer 213. The coating layer 213 preferably comprises a material that has a relatively low oxygen transmission rate and a relatively high transparency. In an embodiment the coating layer 213 comprises an inorganic material, for example—but not limited to—aluminum oxide or silicon dioxide. Aluminum oxide and silicon dioxide are materials that are highly transparent and have a relatively low oxygen transmission rate. The coating layer 213 may consist of a single layer of material or alternatively of a multilayer stack of, for example, two or more inorganic layers. The coating layer 213 reduces the transport of oxygen into the second polymer containing matrix 211 and the luminescent material 212. In particular when the luminescent material 212 comprises an organic luminescent material and/or quantum dot material which are relatively sensitive towards degradation due to oxygen, the photo-chemical stability of the luminescent material 212 is improved due to the coating layer 213. As a result, the life time of the luminescent material 212 and therefore that of the discrete particle 210 is improved. For example, lowering the oxygen concentration to a value below 0.1 vol. % in the polymer containing matrix 211 by applying a coating layer 213, may result in an improvement of the lifetime of the transparent discrete particle 210 by a factor 5 to 10. The coating layer 213 may be applied by means of chemical vapor deposition (CVD) or atomic layer deposition (ALD) processes. Both CVD and ALD processes can be run in a fluid bed reactor, for example.

FIG. 3i schematically depicts an alternative embodiment of a converter device 200 comprising a coating layer 215 for improving the life time of the converter device 200. The converter device 200 further comprises a first polymer containing matrix 201 containing discrete particles 210, as for example shown in FIG. 1 or FIG. 3f. The coating layer 215, like the coating layer 213, preferably comprises a material that has a relatively low oxygen transmission rate and a relatively high transparency. In an embodiment the coating layer 215 comprises an inorganic material, for example—but not limited to—aluminum oxide or silicon dioxide. Aluminum oxide and silicon dioxide are materials that are highly transparent and have a very low oxygen transmission rate. The coating layer 215 may consist of a single layer of material or alternatively of a multilayer stack of, for example, two or more inorganic layers. The coating layer 215 reduces the transport of oxygen into the second polymer containing matrix 211, increasing the life time of the luminescent material and hence that of the converter device 200. Alternatively, the discrete particles 210 may contain a coating layer as well, as shown in FIG. 3h.

Applications include retrofit bulb, LED TL tubes (TLED), or such materials can be used as paint on a wall which can be illuminated by blue LEDs.

EXAMPLE 0.1 wt % Lumogen F Yellow 083 (BASF) was molecularly dissolved in 20 wt. % PMMA in di-chloromethane. 10 micron thickness films were processed by using a doctor blade. Subsequently, small particles/flakes of this material were produced by milling. Flakes were subsequently incorporated in a flexible matrix of PDMS Sylgard 184 (1:10 ratio crosslinker). Next, the mixture was poured onto a flat surface and cured at 60 degrees Celsius for 10 hours obtaining a composite with high flexibility but also good luminescence and photo-chemical stability.

The invention claimed is:

1. A lighting device comprising (a) a light source, for producing light source light, and (b) a transparent converter device, for converting at least part of the light source light, wherein the transparent converter device comprises a first polymer containing matrix containing discrete particles, wherein the discrete particles comprise a second polymer containing matrix with luminescent material molecularly dispersed therein, wherein the luminescent material comprises an organic dye.

2. The lighting device according to claim 1, wherein the discrete particles have dimensions in the range of 0.1 μm-5 mm.

3. The lighting device according to claim 1, wherein the discrete particles have length/width aspect ratios of at least 2.

4. The lighting device according to claim 1, wherein the first polymer containing matrix comprises a first polymer and wherein the second polymer containing matrix comprises a second polymer, and wherein first polymer and the second polymer are substantially different.

5. The lighting device to claim 1, wherein the light source is at least partially embedded in the transparent converter device.

6. The lighting device according to claim 1, wherein the light source comprises a solid state LED light source or laser diode.

7. The lighting device according to claim 1, wherein the first polymer containing matrix comprises a binder containing coating layer.

8. The lighting device according to claim 1, wherein the first polymer containing matrix is a continuous layer.

9. The lighting device to claim 1, wherein the transparent converter device is a flexible unit.

10. The lighting device according to claim 1, wherein the discrete particles further comprise a coating layer for improving the life time of the luminescent material.

11. The lighting device according to claim 1, wherein the transparent converter device further comprises a coating layer for improving the life time of the luminescent material.

12. The lighting device according to claim 1, wherein the first polymer containing matrix has an oxygen transmission rate of equal to or less than 50 cm3/m2·day·bar.

13. The transparent converter device according to claim 12, wherein the first polymer containing matrix comprises one or more of a poly urethane, a polyalkane, a polyacrylate and a siloxane, and wherein the second polymer containing matrix comprises on one or more polymers selected from the group consisting of PEN (polyethylene napthalate), PC (polycarbonate), polymethylacrylate (PMA), polymethylmethacrylate (PMMA) (Plexiglas or Perspex), cellulose acetate butyrate (CAB), polyvinylchloride (PVC), polyethyleneterephthalate (PET) (and its copolymers), (PETG) (glycol modified polyethyleneterephthalate), COC (cyclo olefin copolymer), and polystyrene.

14. A transparent converter device, for converting at least part of light source light, comprising a first polymer containing matrix containing discrete particles, wherein the discrete particles comprise a second polymer containing matrix with luminescent material, molecularly dispersed therein, wherein the luminescent material comprises an organic dye.

15. The transparent converter device according to claim 14, wherein the discrete particles have dimensions in the range of 0.1 μm-5 mm.

16. The transparent converter device according to claim 14, wherein the first polymer containing matrix comprises a binder containing coating layer.

17. The transparent converter device according claim 14 wherein the first polymer containing matrix is a continuous layer.

18. The transparent converter device according to claim 14, wherein the discrete particles further comprise a coating layer for improving the life time of the luminescent material.

19. The transparent converter device according to claim 14, wherein the transparent converter device further comprises a coating layer for improving the life time of the luminescent material.

20. The transparent converter device according to claim 14, wherein the first polymer containing matrix has an oxygen transmission rate of equal to or less than 50 cm3/m2·day·bar.

21. The lighting device according to claim 14, wherein the first polymer containing matrix comprises one or more of a poly urethane, a polyalkane, a polyacrylate and a siloxane, and wherein the second polymer containing matrix comprises on one or more polymers selected from the group, consisting of PEN (polyethylene napthalate), PC (polycarbonate), polymethylacrylate (PMA), polymethylmethacrylate (PMMA) (Plexiglas or Perspex), cellulose acetate butyrate (CAB), polyvinylchloride (PVC), polyethyleneterephthalate (PET) (and its copolymers), (PETG) (glycol modified polyethyleneterephthalate), COC (cyclo olefin copolymer), and polystyrene.

* * * * *